United States Patent
Matsubara (10) Patent No.: US 7,410,545 B2
(45) Date of Patent: Aug. 12, 2008

(54) SUBSTRATE PROCESSING METHOD OF AND SUBSTRATE PROCESSING APPARATUS FOR FREEZING AND CLEANING SUBSTRATE

(75) Inventor: Hideaki Matsubara, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 58 days.

(21) Appl. No.: 11/434,322

(22) Filed: May 11, 2006

(65) Prior Publication Data

US 2006/0266382 A1 Nov. 30, 2006

(30) Foreign Application Priority Data

May 27, 2005 (JP) ............... 2005-154868

(51) Int. Cl.
*B08B 3/04* (2006.01)
(52) U.S. Cl. ..................... 134/33; 134/6; 134/25.4; 134/26; 134/30; 134/32; 134/35; 134/36; 134/42; 134/902
(58) Field of Classification Search ............ 134/6, 134/25.4, 26, 30, 32, 33, 35, 36, 42, 902
See application file for complete search history.

(56) References Cited

U.S. PATENT DOCUMENTS

| | | | | |
|---|---|---|---|---|
| 4,817,652 A | * | 4/1989 | Liu et al. ............ | 134/102.1 |
| 4,883,775 A | * | 11/1989 | Kobayashi ............ | 134/4 |
| 5,645,755 A | * | 7/1997 | Wiesenfeld et al. ........ | 252/70 |
| 5,857,474 A | * | 1/1999 | Sakai et al. ............ | 134/102.3 |
| 2002/0155707 A1 | * | 10/2002 | Moore et al. ............ | 438/689 |

FOREIGN PATENT DOCUMENTS

| | | | |
|---|---|---|---|
| EP | 0428983 A2 | * | 5/1991 |
| JP | 62-169420 | * | 7/1987 |
| JP | 03-261142 | * | 11/1991 |
| JP | 9-186123 | | 7/1997 |
| JP | 11-31673 | | 2/1999 |
| JP | 11-340185 | | 12/1999 |
| JP | 2001-358108 | | 12/2001 |

* cited by examiner

*Primary Examiner*—Sharidan Carrillo
(74) *Attorney, Agent, or Firm*—Ostrolenk, Faber, Gerb & Soffen, LLP

(57) ABSTRACT

A substrate immersed in pure water held inside a processing bath disposed to a cleaning unit 1 and accordingly washed, as it bears an aqueous film on its surface, is transported by a substrate transportation mechanism 3 to a spin-processing unit 2. The substrate rotates in the spin-processing unit 2, thereby adjusting the thickness of the aqueous film on the substrate surface. As the aqueous film is then frozen, the volume of the aqueous film expands, adhesion between the substrates and particles adhering to the substrate surface becomes weak, or further the particles are separated from the substrate surface. The substrate transportation mechanism 3 transports thus frozen substrate to the cleaning unit 1 from the spin-processing unit 2, and the substrate is immersed in a processing liquid held inside the processing bath. The overflowing processing liquid thaws and removes the aqueous film, and particles on the substrate surface are discharged outside the substrate.

10 Claims, 5 Drawing Sheets

SUBSTRATE PROCESSING METHOD OF AND SUBSTRATE PROCESSING APPARATUS FOR FREEZING AND CLEANING SUBSTRATE

CROSS REFERENCE TO RELATED APPLICATION

The disclosure of Japanese Patent Application No. 2005-154868 filed May 27, 2005 including specification, drawings and claims is incorporated herein by reference in its entirety.

BACKGROUND OF THE INVENTION

1. Field of the Invention

The present invention relates to a substrate processing method of and a substrate processing apparatus for cleaning substrates of various types such as semiconductor wafers, glass substrates for photomask, glass substrates for liquid crystal display, glass substrates for plasma display and optical disk substrates.

2. Description of the Related Art

As a conventional solution to remove fine particulate matters (hereinafter referred to simply as "particles") adhering to surfaces of substrates, a substrate processing apparatus which supplies a processing liquid to a substrate surface and cleans the substrate surface is known. In the apparatus described in Japanese Unexamined Patent Application Publication No. 2001-358108 for instance, a substrate is immersed in a processing liquid to which ultrasonic vibrations are applied for a higher efficiency of cleaning the substrate. Describing in more specific details, ultrasonic vibrations vibrates particles adhering to a substrate and separates the particles off from the substrate surface, or ultrasonic vibrations make cavitations and bubbles created in the processing liquid act upon the substrate, whereby the substrate is physically cleaned.

Another approach for removal of particles adhering to a substrate is cleaning which uses a chemical solution such as SC1 (a mixture solution of aqueous ammonia and aqueous hydrogen peroxide). In the apparatus described in Japanese Unexamined Patent Application Publication No. H11-340185 for instance, a substrate is immersed in a chemical solution bath filled with SC1 and a surface layer of the substrate and particles adhering to the substrate surface are etched and accordingly removed.

Meanwhile, in the apparatus described in Japanese Unexamined Patent Application Publication No. H11-31673, particles adhering to a substrate are frozen together with a liquid, high-pressure pure water or cold pure water is then sprayed over the substrate and an ice film is peeled off from the substrate, whereby the substrate is cleaned.

SUMMARY OF THE INVENTION

By the way, a device which is typically a semiconductor has increasingly finer patterns and more advanced functions and is more and more precise these days, which has lead to a new problem that defects (pattern damage) occur in patterns formed on a surface of a substrate during cleaning of the substrate. For details, in ultrasonic cleaning, there is the case that patterns formed on a surface of the substrate, due to their fragile structures, collapse under stress as ultrasonic vibrations vibrate the substrate. Cleaning with a stronger ultrasonic output for removal of particles adhering to a surface of a substrate could thus make patterns defective, while cleaning with a lowered ultrasonic output for the sake of control of defects in the patterns could result in failed particle removal.

Further, a device which needs have fine patterns, advanced functions and a high precision must be protected from excessive etching of a substrate surface, for the purpose of preventing device defects. A requirement is for example that the amount of etching on a substrate surface, namely, the etching thickness is one angstrom or less. Despite this, where particles adhering to a substrate surface are to be removed forcibly using a chemical solution such as SC1, excessive etching of the substrate surface (over the etching thickness of 2 through 3 angstroms or more) will occur, so they contribute to device defects.

Peeling of an ice film containing particles adhering to a substrate surface demands considerable physical force, which could damage a device.

The invention has been made in light of the problems described above, and accordingly, an object of the invention is to provide a substrate processing method and a substrate processing apparatus with which it is possible to remove particles adhering to a substrate without damaging the substrate.

The invention is directed to a substrate processing method of and a substrate processing apparatus for cleaning a substrate. To achieve the object described above, a first aspect of the invention comprises a first step of rotating a substrate whose surface bears an aqueous film and accordingly adjusting the thickness of the aqueous film, a second step of freezing the aqueous film after the first step and a third step of thawing the aqueous film thus frozen and removing the aqueous film from the surface of the substrate.

To achieve the object described above, a second aspect of the invention comprises a freezing step of freezing an aqueous film as it adheres to a surface of the substrate and a thawing/removing step of bringing the aqueous film thus frozen into contact with a processing liquid which flows in a predetermined direction, thereby thawing the aqueous film and removing the aqueous film off from the surface of the substrate.

To achieve the object described above, a third aspect of the invention comprises a rotator which rotates a substrate whose surface bears an aqueous film and accordingly adjusts the thickness of the aqueous film, a freezer which freezes the aqueous film whose thickness has been adjusted by the rotator, and a thawing/removing unit which thaws the aqueous film thus frozen and removes the aqueous film off from the surface of the substrate.

The above and further objects and novel features of the invention will more fully appear from the following detailed description when the same is read in connection with the accompanying drawing. It is to be expressly understood, however, that the drawing is for purpose of illustration only and is not intended as a definition of the limits of the invention.

DETAILED DESCRIPTION OF THE PREFERRED EMBODIMENTS

<Particle Removal Effect Due to Freezing of Aqueous Film>

The inventor of this application verified through experiments the effect of removing particles which is attained when an aqueous film adhering to a surface of a substrate is frozen. Describing in more specific details, the inventor compared and evaluated a particle removal rate with an aqueous film frozen relative to that with an aqueous film not frozen. Chosen as a typical example of a substrate for evaluation was a bare Si substrate (seating no pattern at all). The removal rates were investigated as for two types of contaminant particles (whose particle diameters are 0.1 µm or larger) of (i) SiN (silicon nitride) and (ii) Si dust.

Figure 1A:
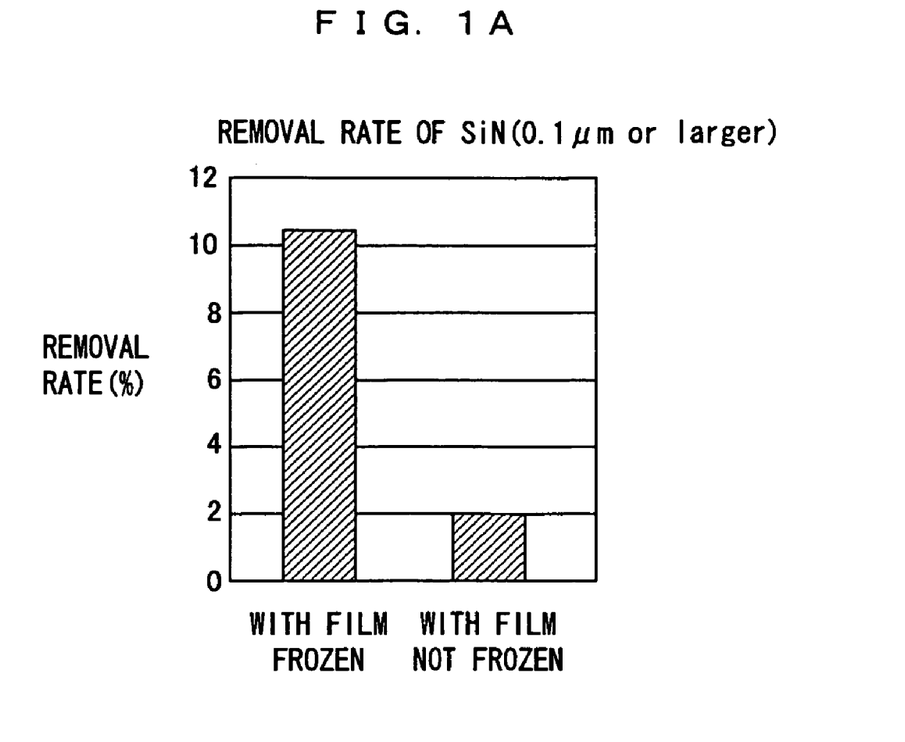
FIGS. 1A and 1B are graphs which show the relationship between a particle removal rate and whether an aqueous film is frozen or not.
Figure 1B:
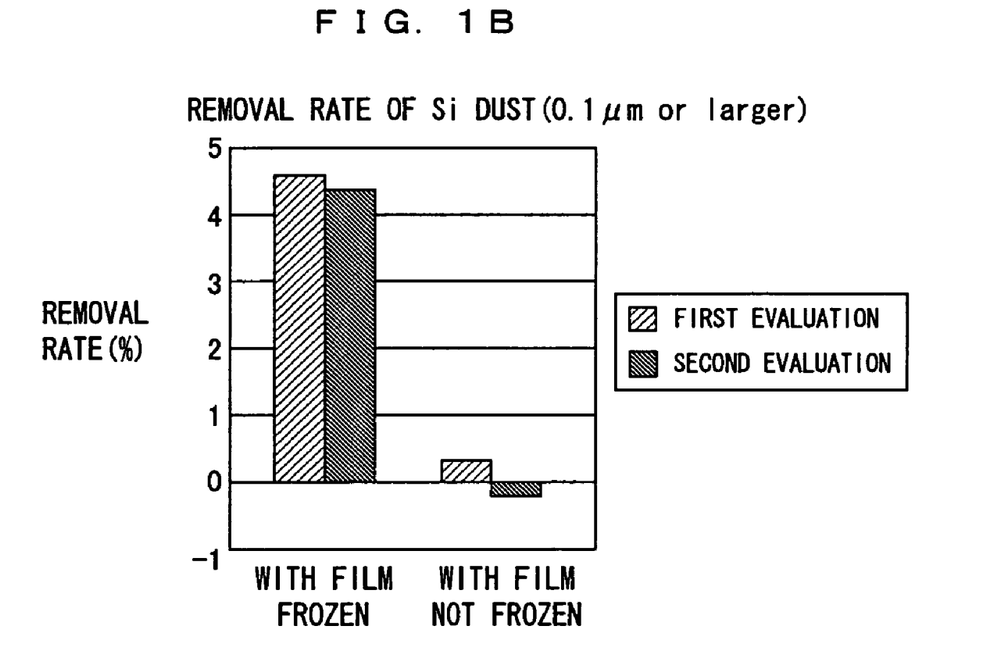

FIGS. 1A and 1B are graphs which show the relationship between a particle removal rate and whether an aqueous film is frozen or not. In FIG. 1A shows the removal rate of SiN while FIG. 1B shows the removal rate of Si dust. As for Si dust, two times of evaluation were performed with an aqueous film frozen and with an aqueous film not frozen respectively, for confirmation of the reproducibility of experimental results. The experimental results were obtained following the procedure below.

First, the procedure for evaluation of the removal rate of SiN with an aqueous film frozen (WITH FILM FROZEN) will now be described. First, the Si substrate is cleaned through APM cleaning (which is cleaning with a mixture solution of ammonia ($NH_4OH$), aqueous hydrogen peroxide ($H_2O_2$) and pure water ($H_2O$)). Following this, the substrate is put under forced contamination using a single-wafer-type substrate processing apparatus (Spin processor MP-2000 manufactured by Dainippon Screen Mfg. Co., Ltd.). To be more specific, while rotating the substrate, a dispersion liquid in which particles (SiN) are dispersed is supplied to the substrate at a nozzle which is located facing the substrate. The amount of the dispersion liquid, the number of revolutions of the substrate and the processing time are appropriately adjusted so that approximately 5000 particles will adhere to the surface of the substrate. The number of the particles adhering to the surface of the substrate (initial count) is thereafter measured.

Next, pure water (DIW; deionized water) is supplied to the substrate as a rinsing liquid while rotating the substrate, thereby rinsing the substrate, and the substrate is then kept rotating without any supply of the rinsing liquid to the substrate to thereby dry the substrate for 15 seconds. This does not intend to perfectly dry the substrate, but aims at spreading thin the aqueous film (DIW film) adhering to the surface of the rinsed substrate and adjusting the thickness of the aqueous film. For details, the surface of the APM-cleaned substrate is hydrophilic, and therefore, the surface of the rinsed substrate bears the aqueous film whose thickness is on the order of millimeters. Noting this, the aqueous film is partially spun off from the substrate utilizing the centrifugal force developed by rotations of the substrate, and the thickness of the aqueous film is adjusted to be equal to the particle diameter of the particles or less which is on the order of sub microns.

The substrate is thereafter loaded into a freezer in which the aqueous film is frozen over 12 through 15 hours. Thus frozen substrate is loaded into a cleaning unit equipped with a processing bath (Batch-type cleaning apparatus FL820 manufactured by Dainippon Screen Mfg. Co., Ltd.), this cleaning unit thaws the aqueous film, and the aqueous film is removed from the surface of the substrate. Describing in more specific details, the frozen substrate is immersed in the processing liquid (pure water) which is held inside and flows over (at the rate of 20 L/min) the processing bath for 20 minutes, thereby cleaning the substrate. The substrate cleaned off of the aqueous film is unloaded, and the number of the particles adhering to the surface of the cleaned substrate is measured. The particle count after cleaning is compared with the initial (before cleaning) particle count already measured, and the removal rate is calculated.

With respect to the procedure for evaluation of the removal rate of SiN with an aqueous film not frozen (WITH FILM NOT FROZEN), the substrate is immersed in the processing liquid inside the processing bath without freezing the aqueous film after rinsing and drying (for adjustment of the thickness of the aqueous film) of the substrate. In other words, except for the absence of loading/unloading of the substrate to and from the freezer, the processing flow is otherwise similar to that for where the aqueous film is frozen.

Meanwhile, for evaluation of the removal rate of Si dust, at the stage of forced contamination of the substrate following APM cleaning, a dispersion liquid in which Si dust instead of SiN is dispersed may be supplied to the substrate. The processing flow is otherwise similar to that for the procedure for evaluation of the removal rate of SiN.

As clearly shown in FIGS. 1A and 1B, comparing freezing of the aqueous film (WITH FILM FROZEN) with non-freezing of the aqueous film (WITH FILM NOT FROZEN), the removal rate is dramatically higher where the aqueous film is frozen for both SiN and Si dust than where the aqueous film is not frozen. Further, as shown in FIG. 1B, the removal rate improves both in the first evaluation and the second evaluation when the aqueous film is frozen, which proves the reproducibility of experimental results.

These results have clarified that freezing of an aqueous film promotes removal of particles off from a substrate surface. The mechanism of the improvement of the particle removal rate is explained as follows. Even after drying of a substrate, a surface of the substrate still seats an aqueous film when observing at the molecular level, and the aqueous film has entered between the substrate and particles adhering to the surface of the substrate due to centrifugal force developed by rotations of the substrate. When the aqueous film is frozen in this state, the volume of the aqueous film itself expands (When water at zero degrees centigrade changes to ice at zero degrees centigrade, the volumes increase to about 1.1 times.). In other words, if there is any aqueous film present at the interface between particles and a substrate, the aqueous film swells at this interface. This weakens adhesion between the substrate and the particles surely, and further separates the particles from the surface of the substrate.

By immersing of the substrate which carries thus frozen aqueous film into the processing liquid held inside the processing bath, the aqueous film is thawed and removed off from the surface of the substrate. That is, the particles contained in the aqueous film adhering to the substrate weakly and the particles contained in the aqueous film already separated from the surface of the substrate are easily removed from the substrate, and then discharged to outside the substrate together with the processing liquid which flows over from the processing bath. Where the aqueous film is not frozen on the contrary, the adhesion between the substrate and the particles will be never weakened before cleaning, and therefore, particle removal will be dependent solely upon the overflowing processing liquid within the processing bath.

Noting the above, an aqueous film adhering to a surface of a substrate may be frozen, the frozen aqueous film may then be thaw and removed, to thereby improve the removal rate of particles adhering to the surface of the substrate. Specific embodiments will now be described with reference to the associated drawings.

An Embodiment of Substrate Processing Apparatus

Figure 2:
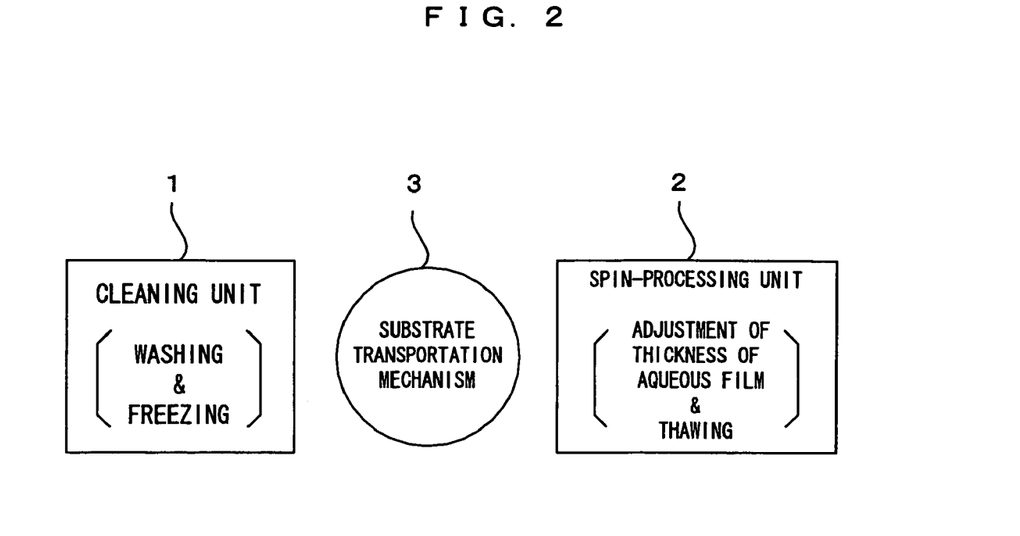
FIG. 2 is a layout plan which illustrates an embodiment of the substrate processing apparatus according to the invention.

FIG. 2 is a layout plan which illustrates an embodiment of the substrate processing apparatus according to the invention. In this substrate processing apparatus, a cleaning unit 1 and a spin-processing unit 2 are disposed over a certain distance from each other, and a substrate transportation mechanism 3 is disposed between these two units. In this apparatus, the cleaning unit 1 is a unit which immerses a substrate in a processing liquid and subjects a substrate surface to washing and thawing. The substrate transportation mechanism 3 transports the substrate finally washed in the cleaning unit 1 to the spin-processing unit 2. The spin-processing unit 2 is a unit which rotates the substrate, thereby adjusting the amount of an aqueous film (the thickness of the aqueous film) adhering to the surface of the washed substrate, and then freezes the substrate, thereby freezing the aqueous film whose thickness has been thus adjusted. The substrate transportation mechanism 3 transports the frozen substrate to the cleaning unit 1 which will then thaw the aqueous film which has been frozen. The substrate transportation mechanism 3 is a mechanism which is in a popular use, and therefore, its structure and operation will not be described here.

Figure 3:
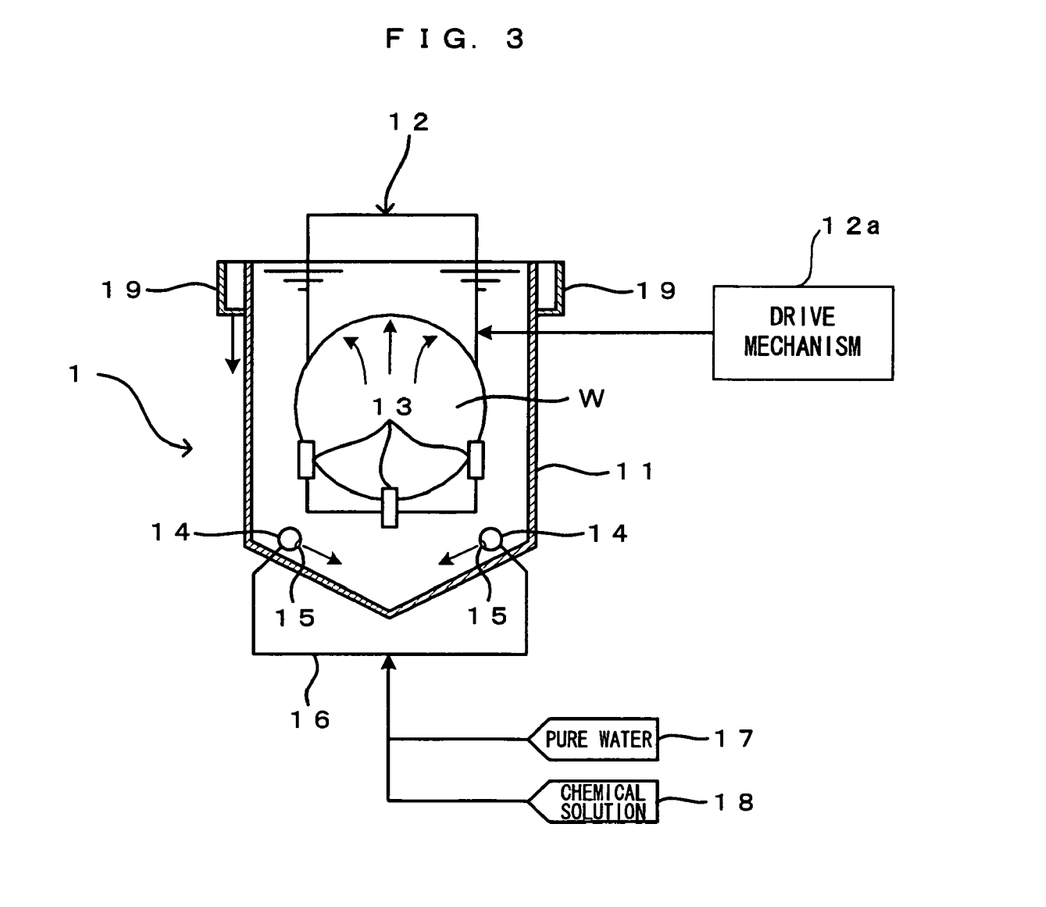
FIG. 3 is a cross sectional view of the structure of a cleaning unit disposed to the substrate processing apparatus which is shown in FIG. 2.

FIG. 3 is a cross sectional view of the structure of the cleaning unit disposed to the substrate processing apparatus which is shown in FIG. 2. The cleaning unit 1 comprises a processing bath 11 which holds processing liquids such as a chemical solution and pure water. The substrate transportation mechanism 3 loads a substrate W, which may be a semiconductor wafer, into the processing bath 11, and the substrate is held and subjected to washing and thawing with the processing liquids inside this single processing bath 11. Disposed inside the processing bath 11 is a lifter 12 which holds multiple substrates W in the upright position. The lifter 12 is driven by a drive mechanism 12a and held between an internal position (the position shown in FIG. 3) inside the processing bath 11 and an upper position above the processing bath 11 so that the lifter 12 can move along the up-down direction. The lifter 12 comprises three substrate holder guides 13 which hold multiple substrates W. Plural notch-like holding grooves engaged to outer rim sections of the substrates W partially are formed at predetermined intervals to the three substrate holder guides 13 each, to thereby hold the substrates W in such a manner that the surfaces of the substrates W are positioned orthogonal to the longitudinal direction (horizontal direction) of the substrate holder guides 13.

There are two pipe-shaped processing liquid supply nozzles 14 are installed approximately horizontally near the inner bottom of the processing bath 11, and each processing liquid supply nozzle 14 has multiple discharge holes 15 through which a processing liquid is gushed out. In addition, each processing liquid supply nozzle 14 is connected to a processing liquid supply duct 16, thereby defining a through flow channel. The processing liquid supply duct 16 is connected to both a pure water supplier 17 and a chemical solution supplier 18. Pure water or the chemical solution is therefore fed to the processing bath 11 at each processing liquid supply nozzle 14 via the processing liquid supply duct 16.

The pure water supplier 17 supplies pure water (DIW) which is for final washing after predetermined substrate processing, while the chemical solution supplier 18 supplies the chemical solution to remove particles adhering to a substrate surface securely during thawing. Such a chemical solution may be an alkaline cleaner liquid in which the ammonia concentration is extremely low (1% or less) for instance, for the purpose of suppressing the amount of etching of the substrate surface (the etching thickness) down to one angstrom or less, or more preferably, down to 0.4 angstrom or less. In the event that more than one type of chemical solutions need be used, for each one of the chemical solutions, a chemical solution supplier having a similar structure may be disposed.

The processing liquid which is discharged at the respective processing liquid supply nozzles 14 and thereby gushed out from right and left both sides rises while creating upward currents in a central portion of the bath and flow over at the opening which is at the top of the bath. An overflow bath 19 receives, together with the processing liquid, contaminant particulate matters such as particles detached from the substrate surfaces by thus overflowing processing liquid, whereby the contaminant particulate matters are discharged outside the bath.

Figure 4:
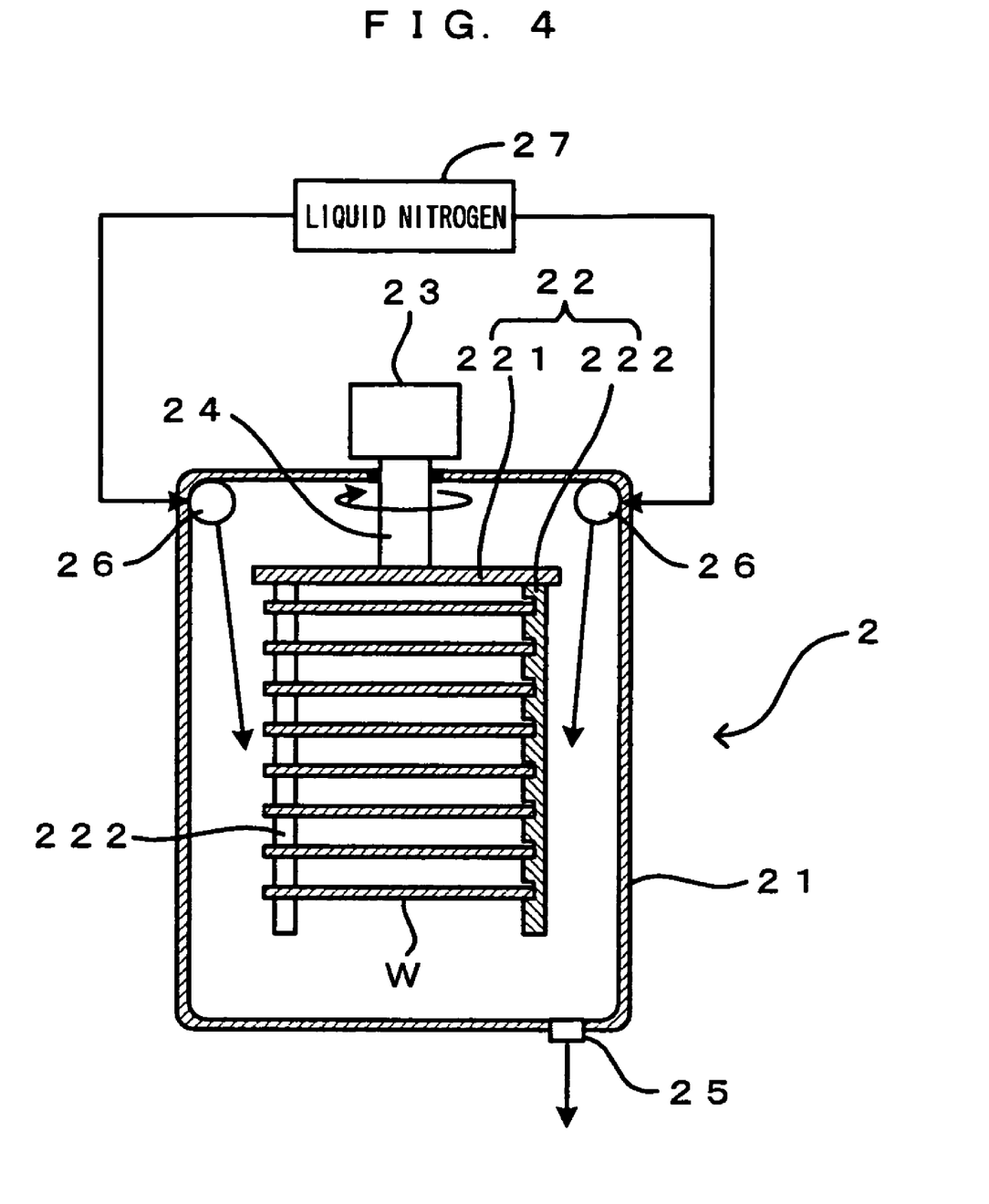
FIG. 4 is a cross sectional view of the structure of a spin-processing unit disposed to the substrate processing apparatus which is shown in FIG. 2.

FIG. 4 is a cross sectional view of the structure of the spin-processing unit disposed to the substrate processing apparatus which is shown in FIG. 2. The spin-processing unit 2 comprises a processing chamber 21 inside which the thicknesses of the aqueous films adhering to the substrates W are adjusted while the substrates W are rotated and the aqueous films are frozen with supply of a refrigerant such as cold nitrogen to the substrates W. The processing chamber 21 holds the multiple substrates W approximately horizontally which have been loaded into inside by the substrate transportation mechanism 3. For details, a carrier 22 holds the multiple substrates W so that they are spaced apart from each other but stacked one over the other. The carrier 22 comprises a carrier main body 221 and for example three substrate holding columns 222 which extend downward from the bottom surface of the carrier main body 221 and hold the multiple substrates W. Plural notch-like holding grooves engaged to outer rim sections of the substrates W partially are formed at predetermined intervals to the three substrate holding columns 222 each, to thereby hold the substrates W such that the surfaces of the substrates W are positioned orthogonal to the longitudinal direction (vertical direction) of the substrate holding columns 222.

A spin motor 23 (which corresponds to the "rotator" of the invention) is connected to the carrier 22 so that when driven by the spin motor 23, the carrier 22 rotates about a vertical axis. That is, the bottom end of a rotation shaft 24 linked with a rotation shaft of the spin motor 23 is connected with the carrier main body 221, and owing to the drive provided by the spin motor 23, the substrates W held by the substrate holding columns 222 rotate about a vertical axis. The centrifugal force developed by rotations of the substrates W spins off a part of the aqueous films adhering to the substrates W, thereby adjusting the thicknesses of the aqueous films. There is a drainage port 25 at the bottom of the processing chamber 21, through which the aqueous films spun off from the substrates can be discharged to outside the system.

Further, at the top surface of the processing chamber 21, two refrigerant supply nozzles 26 are installed, as the "freezer" of the invention, so that they sandwich the multiple stacked substrates W from the right-hand side and the left-hand side. The refrigerant supply nozzles 26 are connected to a liquid nitrogen supplier 27. Liquid nitrogen supplied from the liquid nitrogen supplier 27 is gasified, and gasified cold nitrogen is supplied toward the substrates W which are housed inside the processing chamber 21. The cold nitrogen gas is below zero degrees centigrade, or may sufficiently be at a temperature close to this. This cools down the substrates W and freezes the aqueous films adhering to the substrates W. For efficient supply of the cold nitrogen gas to the respective substrates W, the cold nitrogen gas may be fed to each substrate W by using a nozzle having multiple injection holes toward the stack direction of the substrates W (i.e., the vertical direction), or disposing an agitating mechanism such as a fan inside the processing chamber 21 alternatively.

Figure 5:
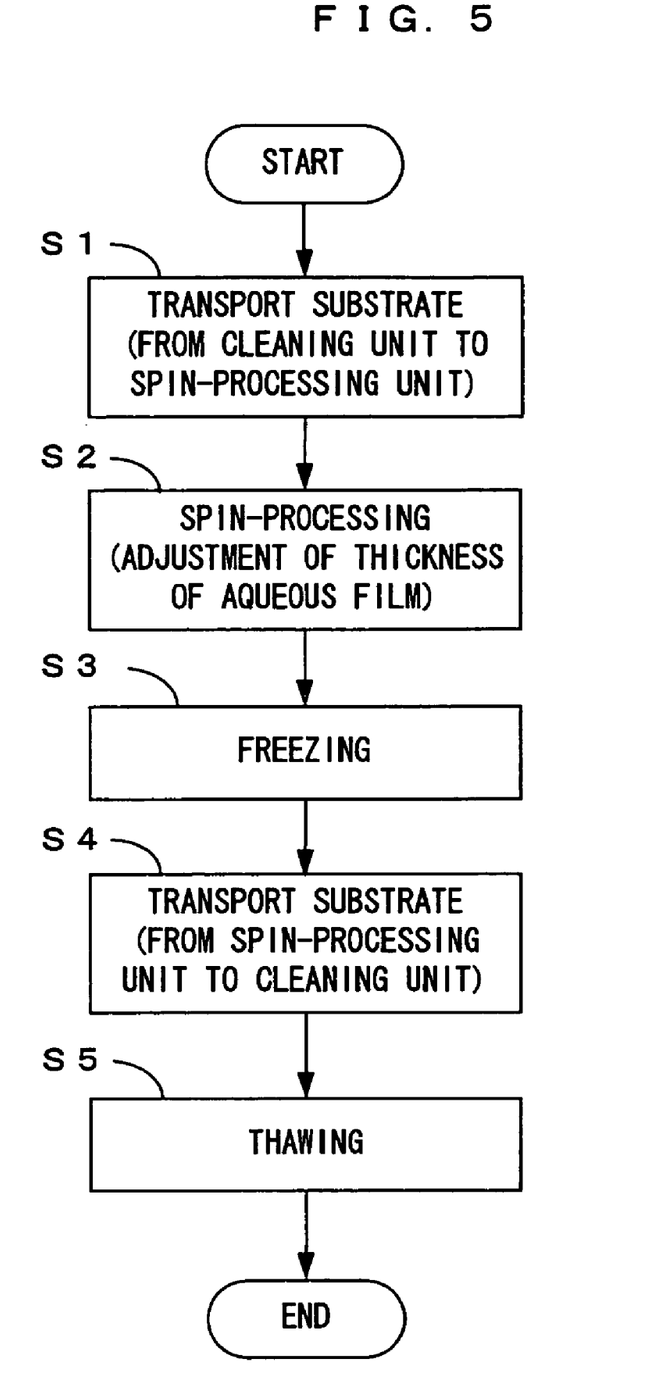
FIG. 5 is a flow chart of an operation of the substrate processing apparatus which is shown in FIG. 2.
Figure 6A:
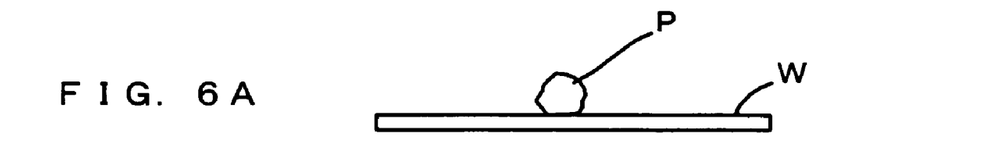
FIGS. 6A through 6E are schematic diagrams which show the operation of the substrate processing apparatus which is shown in FIG. 2.

An operation of the substrate processing apparatus having the structure above will now be described. FIG. 5 is a flow chart of the operation of the substrate processing apparatus which is shown in FIG. 2. FIGS. 6A through 6E are schematic diagrams which show the operation of the substrate processing apparatus which is shown in FIG. 2. Subjected to predetermined processing (which may be chemical processing for instance) at the previous step, substrates W are transported to the cleaning unit 1, immersed in pure water which is held inside the processing bath 11 and washed. As shown in FIG. 6A, it is assumed that the surfaces of the substrates W transported to the cleaning unit 1 seat particles P.

Figure 6B:
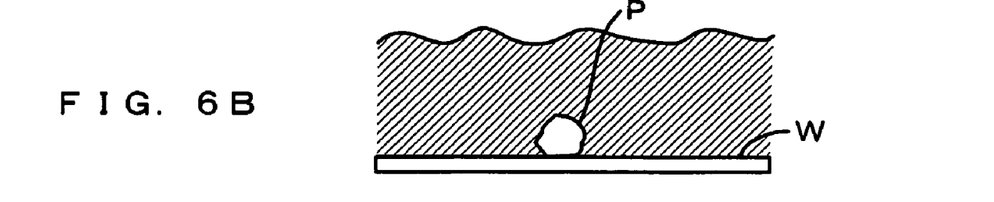

Due to the surface tension of the pure water, aqueous films remain on the surfaces of the substrates washed in the cleaning unit 1 (FIG. 6B). When the substrate surfaces are hydrophilic in particular, a large amount of the aqueous films adhere to the substrate surfaces so that the aqueous films are visible. The substrate transportation mechanism 3 transports the substrates W as they thus seat the aqueous films to the spin-processing unit 2 from the cleaning unit 1 (Step S1).

Figure 6C:
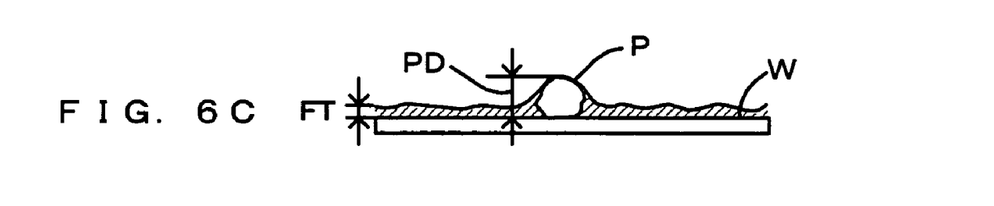

The substrates W loaded into inside the processing chamber 21 of the spin-processing unit 2 rotate about a vertical axis when driven by the spin motor 23. At this stage, the centrifugal force developed by rotations of the substrates W spreads the aqueous films which adhere to the substrate surfaces thinly, the aqueous films are partially spun off from the substrates, and the amount of the aqueous films (the thicknesses of the aqueous films) remaining on the substrate surfaces is adjusted (Step S2). The number of revolutions of the substrates and the spin-processing time are set so that the thicknesses FT of the aqueous films will be equal to or less than the particle diameter PD of particles P, or more preferably, equal to or less than half the particle diameter PD (FIG. 6C). Describing in more specific details, when particles to be removed have the particle diameters of 0.5 µm or less, the processing conditions are set so that the thicknesses FT of the aqueous films will be 0.5 µm or more preferably 0.25 µm. The thicknesses FT of the aqueous films are different dependent also upon the line width of device patterns to be formed on the substrates W, and are accordingly adjusted in light of the particle diameter PD of particles P which could cause device defects, e.g., the particle diameter PD which is half the pattern line width.

Owing to the centrifugal force developed by rotations of the substrates W, the aqueous films come close to the interface between the substrates W and the particles P adhering to the substrate surfaces. In the event that the aqueous films contain a surface active surfactant, the wettability at the surfaces of even very fine particles enhances and the aqueous films can therefore come into even very narrow clearances between the substrates W and the particles securely. For addition of a surface active surfactant to the aqueous films, the surface active surfactant may be mixed in advance with pure water held in the processing bath 11 at the stage of washing inside the cleaning unit 1.

Figure 6D:
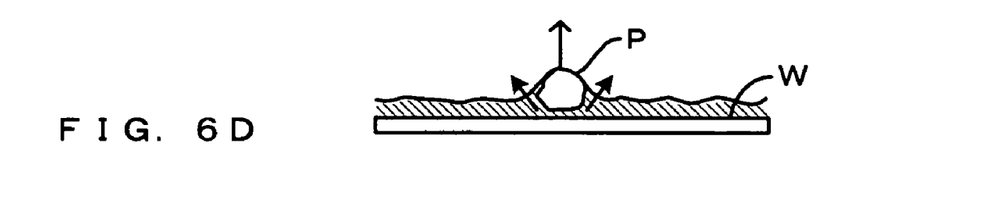

The spin-processing is followed by freezing of the substrates W. For details, cold nitrogen gas is introduced into inside the processing chamber 21, thereby freezing the aqueous films having the adjusted thicknesses and adhering to the substrates W (Step S3; freezing step). The aqueous films consequently expand in volume, and the volumes of the aqueous films entering between the particles P and the substrates W increases. External force hence acts upon the particles P in such a direction which separates the particles P from the substrate surfaces, the adhesion between the substrates W and the particles P becomes weak, and further the particles P leave the substrate surfaces (FIG. 6D). Since the thicknesses FT of the aqueous films adhering to the substrate surfaces are equal to or less than the particle diameter PD, the particles P are not buried in the aqueous films. This ensures that the external force will not act upon the particles P in a direction of pushing the particles P from above against the substrates W and that the external force is concentrated in the direction which separates the particles P from the substrate surfaces. If the thicknesses FT of the aqueous films are equal to or less than half the particle diameter PD, the surfaces of the particles P not opposed against the substrates W will get exposed out from the aqueous films, thereby eliminating an obstacle against the external force which acts upon the particles P in the direction which separates the particles P from the substrate surfaces and further effectively encouraging separation of the particles P from the substrate surfaces.

The freezing of the substrates W is not limited to after the spin-processing but may be executed concurrently with the spin-processing, in which case considering the time since introduction of cold nitrogen gas into inside the processing chamber 21 until freezing of the aqueous films, the number of revolutions of the substrates and the spin-processing time may be adjusted. When the freezing is performed in parallel with the spin-processing, the throughput of the apparatus improves. Meanwhile, when the spin-processing is followed by the freezing of the substrates W, control of the thicknesses of the aqueous films is easy.

Figure 6E:
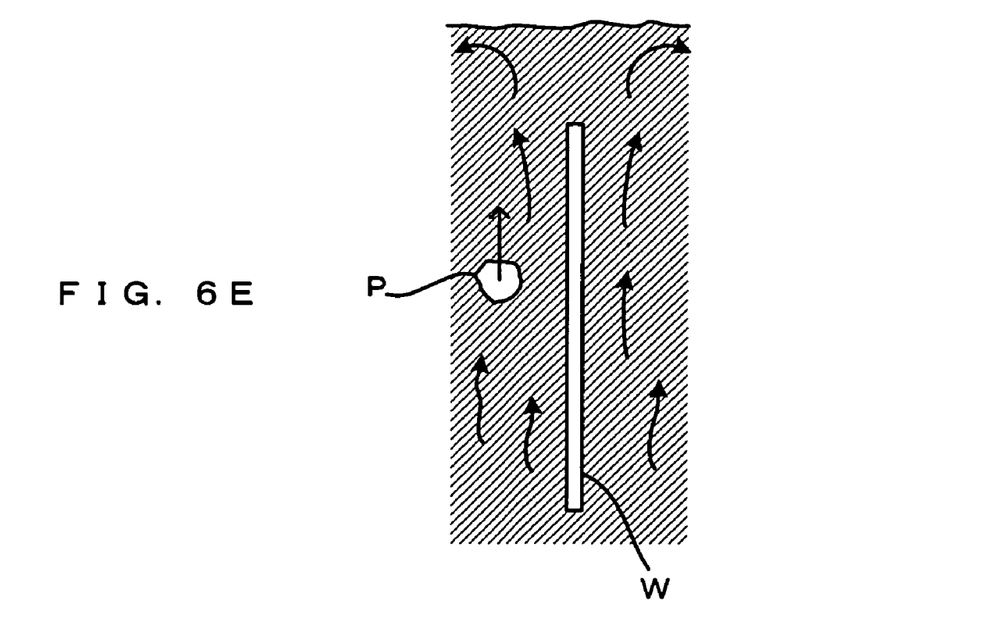

The substrate transportation mechanism 3 transports thus frozen substrates W back again to the cleaning unit 1 from the spin-processing unit 2 (Step S4). The aqueous films are immersed together with the substrates W into pure water (or pure water in which a surface active surfactant is added) held inside the processing bath 11, thawed and removed off from the substrate surface. At this stage, particles P in the aqueous films weakly adhering to the substrates W or already separated from the surfaces of the substrates are removed off from the substrate surfaces together with the aqueous films (Step S5; thawing/removing step). The particles are then discharged to outside the substrates together with the processing liquid which flows over from the processing bath (FIG. 6E).

For secure removal of the particles P only weakly adhering to the substrates W from the surfaces of the substrates, the particles may be removed using a pH-adjusted chemical solution as a processing liquid. Use of an alkaline cleaner liquid such as aqueous ammonia as such a chemical solution makes it possible to prevent re-adhesion of removed particles P. In this case, the frozen substrates W may be thawed through the following steps. Upon washing inside the cleaning unit 1, at Step S1, the substrates W are transported from the cleaning unit 1 to the spin-processing unit 2. As the substrates W are thus unloaded from the processing bath 11 of the cleaning unit 1, aqueous ammonia adjusted to a predetermined concentration is supplied at the processing liquid supply nozzles 14 into inside the processing bath 11 from the chemical solution supplier 18. The aqueous ammonia flowing into the processing bath 11 from the bottom of the processing bath 11 pushes out pure water at the top of the processing bath 11, during which the concentration of the chemical solution (ammonia) inside the processing bath 11 rises. The pure water in the processing bath 11 is thus replaced with the chemical solution. As this processing liquid replacement is executed before the substrate transportation mechanism 3 transports the substrates W frozen in the spin-processing unit 2 to the cleaning unit 1, washing and thawing with the chemical solution are attained within one processing bath without deteriorating the throughput of the apparatus. To facilitate removal of the particles P from the substrates W, a surface active surfactant may be added to the chemical solution.

As described above, this embodiment requires freezing the aqueous films after adjusting the thicknesses FT of the aqueous films adhering to the substrate surfaces. Expansion of the volume of the aqueous films entering between the substrate surfaces and the particles P adhering to the substrate surfaces weakens adhesion between the substrates W and the particles P or separates the particles from the substrate surfaces. Immersed together with the substrates W into the processing liquid which flows toward above from the bottom of the processing bath 11 and over outside the processing bath, the frozen aqueous films are thawed and removed. It is thus possible to easily remove from the substrates W those particles in the aqueous films weakly adhering to the substrates W or already separated from the surfaces of the substrates, without vibrating the substrates W with external physical force. This realizes removal of the particles P from the substrates W without damaging the substrates W.

Further, requiring adjustment of the thicknesses FT of the aqueous films to below the particle diameter PD of particles P adhering to the substrate surfaces, this embodiment permits external force acting effectively upon the particles P in the direction in which freezing of the aqueous films separates the particles P from the substrate surfaces. In other words, it is possible to concentrate external force which acts upon the particles P in the direction which separates the particles P from the substrate surfaces, while suppressing action of external force in the direction of pushing the particles P toward the substrates W.

Further, in this embodiment, the processing liquid is brought into contact with the frozen aqueous films, thereby thawing the aqueous films, and the overflowing processing liquid removes, together with the processing liquid, from the substrates W those particles contained in the aqueous films weakly adhering to the substrates W or already separated from the surfaces of the substrates. It is therefore possible to reduce a risk of exposing the substrate surfaces directly to the processing liquid and prevent excessive etching of the substrate surfaces with the processing liquid. The particles P are thus removed from the substrates W without damaging the substrates W.

In the event that pure water is used as the processing liquid to thaw the frozen aqueous films, it is possible to remove the particles P by means of pure water which flows over from the processing bath 11 without etching the substrate surfaces. On the contrary, when a chemical solution is used as the processing liquid, it is possible to securely remove from the substrate surfaces even those particles P whose adhesion to the substrates W has been only weakened.

Further, in this embodiment, since the spin motor 23 (rotator) and the refrigerant supply nozzles 26 (freezer) are disposed inside the single processing unit (the spin-processing unit 2), the footprint of the apparatus is reduced. In addition, as the thickness adjustment for the aqueous film and freezing of the aqueous film may be executed concurrently, the throughput can improve.

The invention is not limited to the embodiment above but may be modified to the extent not deviating from the intention of the invention. For instance, although the embodiment above requires immersing the substrates W into pure water which is held inside the processing bath 11 and making the aqueous films adhere to the substrate surfaces, this is not limiting. Pure water may be supplied to the substrate surfaces from a nozzle, or the substrates W may be exposed to a water vapor atmosphere for adhesion of the aqueous films to the substrate surfaces. In the former, after supplying pure water to the substrate surfaces while rotating the substrates W, the substrates W may be kept rotating without supplying the processing liquid, to thereby adjust the thicknesses of the aqueous films which are kept adhering to the substrate surfaces.

Further, although the embodiment above requires immersing the frozen substrates W into the overflowing processing liquid while positioning the substrate surfaces approximately parallel to the vertical direction and accordingly thawing the aqueous films, this is not limiting. The substrates may be immersed in a processing liquid which flows horizontally while positioning the substrate surfaces approximately parallel to the horizontal direction to thaw the aqueous films. In addition, immersing of the multiple substrates W together into the processing liquid is not limiting, the substrates W may be thaw one at a time. The freezing described above according to the embodiment above realizes easy processing of plural substrates at the same time, and as such attains an excellent efficiency in batch processing.

Thawing of the frozen aqueous films is not attained only through immersing of the substrates W into the processing liquid. Instead, the processing liquid may be supplied to the substrate surfaces while rotating the substrates W, in which case the centrifugal force developed by rotations of the substrates W spreads the processing liquid all over the substrates surfaces, the processing liquid come into contact with the aqueous films and the aqueous films are thawed. Particles in the aqueous films weakly adhering to the substrate surfaces or already separated from the surfaces of the substrates due to thawing of the aqueous films are discharged to outside the substrates, together with the processing liquid which flows outward along the diameter direction of the substrates W. At the stage of supplying the processing liquid to the substrates, in order not to vibrate the substrates, it is desirable that the processing liquid which is not pressurized is injected upon the substrates.

Further, although the embodiment above requires adjusting the thicknesses of the aqueous films and freezing the aqueous films both inside the spin-processing unit 2, a separate freezing unit may be disposed independently of the spin-processing unit 2 and these units may respectively adjust the thicknesses of the aqueous films and freeze the aqueous films independently of each other.

Further, for immersing and thawing of the frozen aqueous films in pure water in the embodiment described above, hot pure water may be supplied to the processing bath 11 to thaw the frozen aqueous films. This facilitates thawing of the frozen aqueous films. In this case, a heating unit may be disposed between the pure water supplier 17 and the processing liquid supply nozzles 14, and the heating unit may heat pure water which is supplied from the pure water supplier 17 and produces hot pure water.

Although the invention has been described with reference to specific embodiments, this description is not meant to be construed in a limiting sense. Various modifications of the disclosed embodiment, as well as other embodiments of the present invention, will become apparent to persons skilled in the art upon reference to the description of the invention. It is therefore contemplated that the appended claims will cover any such modifications or embodiments as fall within the true scope of the invention.

What is claimed is:

1. A substrate processing method of cleaning a substrate, comprising:
   a first step of holding said substrate approximately horizontally, a surface of the substrate bearing an aqueous film, a surfactant being added to said aqueous film, rotating said substrate about a vertical axis, and adjusting a thickness of said aqueous film by said rotating;
   a second step of freezing said aqueous film by supplying a refrigerant to said substrate after said first step; and
   a third step of thawing said aqueous film thus frozen and removing said aqueous film from the surface of said substrate.

2. The substrate processing method of claim 1, wherein at said first step, the thickness of said aqueous film is adjusted to be equal to or less than a particle diameter of particles to be removed from the surface of said substrate.

3. The substrate processing method of claim 1, wherein at said third step, said substrate is immersed in a processing liquid which flows in a predetermined direction, thereby thawing said aqueous film thus frozen and removing said aqueous film from the surface of said substrate.

4. The substrate processing method of claim 2, wherein at said first step, the particle diameter of the particles is half a line width of device patterns to be formed on said substrate.

5. The substrate processing method of claim 2, wherein at said first step, the thickness of said aqueous film is adjusted to be equal to or less than half the particle diameter of the particles.

6. The substrate processing method of claim 3, wherein said processing liquid is a pH-adjusted chemical solution.

7. A substrate processing method of cleaning a substrate, comprising:
   a freezing step of freezing an aqueous film to which a surfactant is added as the aqueous film adheres to a surface of said substrate, said freezing step being accomplished by supplying a refrigerant to said substrate; and
   a thawing/removing step of bringing said aqueous film thus frozen into contact with a processing liquid which flows in a predetermined direction, thereby thawing said aqueous film and removing said aqueous film from the surface of said substrate.

8. The substrate processing method of claim 7, wherein at said thawing/removing step, deionized water is brought into contact with said aqueous film as said processing liquid.

9. A substrate processing method of cleaning a substrate, comprising:
   a first step of holding said substrate approximately horizontally, the surface of the substrate bearing an aqueous film, the aqueous film containing a surfactant, rotating said substrate about a vertical axis, and adjusting a thickness of said aqueous film by said rotating;
   a second step of freezing said aqueous film by supplying a refrigerant to said substrate after said first step; and
   a third step of thawing said aqueous film thus frozen and removing said aqueous film from the surface of said substrate using an alkaline cleaner liquid as a processing liquid.

10. A substrate processing method of cleaning a substrate, comprising:
    a freezing step of freezing an aqueous film as it adheres to a surface of said substrate by supplying a refrigerant to said substrate the aqueous film containing a surfactant; and
    a thawing/removing step of bringing said aqueous film thus frozen into contact with a processing liquid which flows in a predetermined direction, thereby thawing said aqueous film and removing said aqueous film from the surface of said substrate, the processing liquid being an alkaline cleaner liquid.

* * * * *